United States Patent [19]

Murakami et al.

[11] Patent Number: 5,108,948
[45] Date of Patent: Apr. 28, 1992

[54] METHOD OF PRODUCING A SEMICONDUCTOR DEVICE HAVING A DISORDERED SUPERLATTICE USING AN EPITAXIAL SOLID DIFFUSION SOURCE

[75] Inventors: Takashi Murakami; Kanamf Otaki; Hisao Kumabe, all of Itami, Japan

[73] Assignee: Mitsubishi Denki Kabushiki Kaisha, Tokyo, Japan

[21] Appl. No.: 272,493

[22] Filed: Nov. 17, 1988

[30] Foreign Application Priority Data

Nov. 28, 1987 [JP] Japan .................................. 62-300974

[51] Int. Cl.⁵ .......................................... H01L 21/20
[52] U.S. Cl. ........................... 437/110; 148/DIG. 95;
   148/DIG. 37; 437/129; 437/133; 437/160;
   437/161; 437/987
[58] Field of Search ..................... 148/DIG. 3, 15, 30,
   148/37, 56, 65, 72, 95, 110, 160, 169;
   156/610–615; 357/61, 91, 17; 372/46, 50;
   437/22, 81, 105, 107, 108, 110, 126, 129, 160,
   161, 133, 905, 939, 946, 987

[56] References Cited

U.S. PATENT DOCUMENTS

| | | | |
|---|---|---|---|
| 4,654,090 | 3/1987 | Burnham et al. | 357/91 |
| 4,771,010 | 9/1988 | Epler et al. | 437/19 |
| 4,810,670 | 3/1989 | Furuyama et al. | 437/129 |
| 4,824,798 | 4/1989 | Burnham et al. | 437/81 |
| 4,830,983 | 5/1989 | Thornton | 437/161 |

FOREIGN PATENT DOCUMENTS

| | | |
|---|---|---|
| 0202089 | 11/1986 | European Pat. Off. |
| 0206496 | 12/1986 | European Pat. Off. |
| 0231075 | 8/1987 | European Pat. Off. |
| 59-202677 | 11/1984 | Japan |

OTHER PUBLICATIONS

"Low Threshold Planar Buried Heterostructure Lasers Fabricated by Impurity-Induced Disordering", Thornton et al., *Appl. Phys. Lett. 47(12), Dec. 15, 1985, pp. 1239–1241.*

"Low-Threshold Disorder-Defined Buried-Heterostructure $Al_xGa_{1-x}As$-GaAs Quantum Well Lasers", Deppe et al., *J. Appl. Phys. 58(12), Dec. 15, 1985, pp. 4515–4520.*

*Primary Examiner*—Olik Chaudhuri
*Assistant Examiner*—William D. Bunch
*Attorney, Agent, or Firm*—Leydig, Voit & Mayer

[57] ABSTRACT

A method of producing a semiconductor device such as a semiconductor laser having a controllably disordered superlattice. The superlattice is grown epitaxially and in the same epitaxial growth process a heavily selenium doped semiconductor layer is also grown in a known spatial relationship to the superlattice. The doped layer is patterned as by etching and then the device is annealed to diffuse selenium impurities from the doped layer. The time and temperature of annealing are controlled such that the impurities diffuse into and thereby disorder regions of the superlattice layer, leaving a non-disordered region which can serve as a resonator in a laser.

14 Claims, 5 Drawing Sheets

METHOD OF PRODUCING A SEMICONDUCTOR DEVICE HAVING A DISORDERED SUPERLATTICE USING AN EPITAXIAL SOLID DIFFUSION SOURCE

FIELD OF THE INVENTION

The present invention relates to a method of producing a semiconductor device having a superlattice which is controllably disordered, and using such a method to produce a semiconductor laser device.

BACKGROUND OF THE INVENTION

An important class of semiconductor laser device is the buried heterojunction type, and an important subcategory of that type includes lasers which employ a superlattice as the active layer. Such devices typically have a central stripe in the active layer of reasonably precise dimension which serves as a resonator, and a pair of regions which bound the central stripe of higher band gap and lower refractive index. One reason for the interest in superlattice buried heterojunction lasers is that the central stripe can be formed fairly simply, by controllably diffusing impurities into the active layer to disorder the regions bounding the central stripe. The diffused impurities, by a process sometimes known as diffusion induced disordering, tend to disorder the crystal structure of the superlattice, achieving the desired band gap and refractive index discontinuity between the disordered and non-disordered regions.

A known process for controllably disordering a superlattice is illustrated in FIGS. 3(a)–3(d). FIG. 3(a) shows a multiple layer structure formed during an epitaxial growth process including a GaAs buffer layer 2 epitaxially grown on a GaAs substrate 1. Thereafter, individual layers of GaAs and $Al_xGa_{1-x}As$ of about 100 Å thickness are alternately grown on the GaAs buffer layer 2 to produce an AlGaAs series superlattice 3 of about 0.5 μm or less in thickness. As is well known, in the superlattice the GaAs layers serve as quantum wells and the AlGaAs layers as quantum barriers. In a typical application, the aluminum and gallium molar proportions in the AlGaAs can be about equal, i.e., $x=0.5$.

After the conclusion of the epitaxial growth process, a further layer is deposited to serve as a source of impurities for the disordering operation. In an exemplary application, the wafer is placed into a vapor plating or sputtering apparatus and as shown in FIG. 3(b), a silicon film 4 is produced by a vapor plating or sputtering. The silicon film is, in some cases, covered with a cap layer such as $SiO_2$. Selective control of the diffusion is accomplished by removing a central stripe from the silicon film 4. That is typically accomplished by depositing a mask using photolithographic techniques, then etching away the central stripe to leave a pair of regions of the film 4 as illustrated in FIG. 3(c).

Having thus deposited and patterned the source of silicon impurities, various techniques are available for diffusing the impurities from the layer 4 into the superlattice. For example, either a closed tube method or an open tube method can be employed. When using the closed tube method, the wafer, in the condition illustrated in FIG. 3(c), is placed into a quartz tube of 16 mm diameter and 20 cm length together with arsenic of about 40 mg. The quartz tube is exhausted to vacuum, and heated up to about 850° C. Under these conditions, the vapor pressure of $As_4$ is about 0.3 atm. Silicon from the silicon film 4 then diffuses into the wafer to a depth of about 1 μm when subjected to a temperature of 850° C. for about 1 hour. Longer annealing times or higher annealing temperatures cause the impurities to diffuse further into the superlattice. Diffusing of the silicon impurities into the crystal structure of the superlattice serves to disorder the superlattice. More particularly, the impurities cause the aluminum and gallium molecules in the lattice to move, and the alternating layers of GaAs and $Al_{0.5}Ga_{0.5}As$ are effectively mixed, producing an $Al_{0.25}Ga_{0.75}As$ crystal structure of uniform composition. FIG. 3(d) depicts the wafer after the disordering, in which the silicon diffused portion 5 has produced a disordered superlattice consisting of a $Al_{0.25}Ga_{0.75}As$ doped with silicon impurities bounding a central undoped stripe which retains its ordered superlattice character.

When using an open tube method, the wafer is heated while flowing hydrogen diluted arsine ($AsH_3$) or argon diluted arsine of a 10% concentration at a flow rate of about 300 cc/min. By this open tube method, the silicon is diffused similarly as in the closed tube method, and the superlattice is controllably disordered in regions 5 as shown in FIG. 3(d). Additionally, this open tube disordering method may also be conducted using germanium rather than silicon as the source of diffusion impurities. The process differs primarily in that film 4, which is deposited after the epitaxial growth phase, is germanium rather than silicon.

As noted above, the reason that controllably disordering a superlattice is important is that the disordered region has a higher energy band gap than the non-disordered superlattice and also has a lower refractive index. Those features are very useful in a laser device because the higher band gap keeps carriers confined within the non-disordered superlattice, and the lower refractive index aids in confining photons within the non-disordered region in waveguide-like fashion. FIG. 4 shows a method of producing a semiconductor laser device using the above-described prior art disordering technique. As shown in FIG. 4(a), an AlGaAs lower cladding layer 9a, an AlGaAs series superlattice active layer 10, an AlGaAs upper cladding layer 9b, and a GaAs contact layer 11 are epitaxially grown on the GaAs substrate 1. Following the epitaxial growth phase, the wafer is placed into an apparatus for vapor plating or sputtering, and as shown in FIG. 4(b) a silicon (or germanium) film 4 is produced on the upper cladding layer. The film is patterned photolithographically, then etched as shown in FIG. 4(c), to remove a strip from the film 4. The wafer is then annealed by a closed tube method or an open tube method, as previously described, resulting in the diffusion of silicon or germanium impurities to disorder the superlattice as shown at 5 in FIG. 4(d). Next, as shown in FIG. 4(e), the film 4 is removed by etching, and as shown in FIG. 4(f), electrodes 14 and 15 are then attached in electrical contact with the semiconductor to complete the semiconductor laser device. It it important that the silicon-containing film be carefully removed before the electrodes are applied because they prevent the formation of a good ohmic contact between the electrode and the semiconductor crystal structure.

In addition to the solid phase diffusion techniques described above, vapor phase diffusion can also be used with certain materials, such as zinc or sulphur, to disorder the superlattice. Since zinc or sulphur have a higher vapor pressure than silicon or germanium. zinc or sulphur may be diffused into the wafer from the vapor phase by heating a quartz tube containing zinc or sulphur to cause diffusion and the resulting disordering of the superlattice. However, if the vapor phase diffusion process is to controllably disorder the superlattice, it is necessary to produce a diffusion mask on the semiconductor prior to diffusion, then to remove the mask before the electrodes can be applied to the laser.

Typical diffusion masks are $SiO_2$ or $Si_3N_4$, and as can be appreciated thin films of those materials are typically deposited by chemical vapor deposition, a technique typically as complex as the sputtering or evaporation used in connection with the silicon or germanium films. After the film is applied, it must then be photolithographically patterned and etched to remove the regions bordering the central stripe. Then following the vapor phase diffusion to the appropriate depth, the $SiO_2$ or $Si_3N_4$ masking material must be removed by a process such as etching. It will therefore be appreciated that although the dopant is carried by a gas in vapor phase diffusion, rather than by a deposited film as in solid phase diffusion, the requirement for depositing and forming the diffusion mask makes the two processes of about equal complexity. Furthermore, the results of vapor phase diffusion tend to be less than satisfactory since the steepness of the boundary surface between the disordered portion of the superlattice and the unaffected portion of the superlattice is lower relative to the steeper boundary surface results realized from solid phase diffusion. As a result, the discontinuity in the refractive index and in the band gap is not as sharp as is desired and thus the disordered region is less efficient in confining electrons and photons in the non-disordered region.

SUMMARY OF THE INVENTION

In view of the foregoing, it is an object of the present invention to provide a method of producing a semiconductor with a controllably disordered superlattice which requires fewer process steps than the methods described above. It is a related object of the present invention to provide such a method which utilizes the same process equipment to the greatest extent possible.

Another object of the present invention is to provide a semiconductor laser device having a controllably disordered semiconductor superlattice which can be produced at a relatively low cost as compared to prior art devices.

Other objects and advantages of the present invention will become apparent from the detailed description given hereinafter. It should be understood, however, that the detailed description and specific embodiments are given by way of illustration only, since various changes and modifications within the spirit and scope of the invention as defined by the appended claims will become apparent to those skilled in the art from this detailed description.

The above objects are realized in accordance with the present invention which provides a method for producing a semiconductor device, such as a laser, having a controllably disordered superlattice. According to the method of the present invention, a selenium doped semiconductor layer is epitaxially grown in a predetermined spatial relationship to a semiconductor superlattice layer. According to an important aspect of the present invention, the selenium doped layer is grown in the same epitaxial growth operation which produced the superlattice. A portion of the selenium doped layer is removed after completion of the epitaxial growth process to form the desired pattern such as a stripe for the laser. The device is then annealed to diffuse the selenium impurities from the doped layer. The annealing conditions such as time and temperature are controlled to cause the selenium dopant to diffuse into and thereby disorder a part of the superlattice layer leaving a non-disordered region determined by the pattern of the doped layer.

It is a feature of the present invention that the vacuum deposition or chemical vapor deposition processes of the prior art are eliminated in that the dopant is applied in the same epitaxial growth process which formed the superlattice. It is a resulting feature that the selenium doped layer need not be removed prior to depositing electrodes because the doped layer is part of the underlying crystal structure, having been epitaxially grown, and by virtue of the fact that the dopant provides electrical continuity between the electrode and the underlying semiconductor layers.

It is a further feature of the invention that the steepness of the boundaries between the disordered and non-disordered regions in the active layer can be as steep as those achieved with silicon solid phase diffusion, and thus can be superior to those achieved with vapor phase diffusion.

It is a further feature of the invention that the process for diffusing impurities into the active layer affords substantial control due to the relatively slow rate of diffusion of selenium through the GaAs type semiconductor materials. Thus, slight variations in diffusion time from wafer to wafer will not be as significant a proportion of the total as similar errors using prior art techniques, and thus the depth of diffusion according to the invention is much more controllable than in the prior art.

DETAILED DESCRIPTION OF THE PREFERRED EMBODIMENTS

Figure 1A:
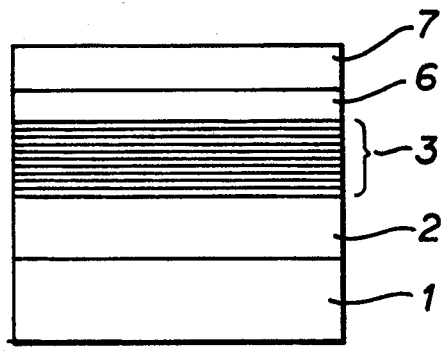
FIGS. 1(a)–1(c) are diagrams showing a method of producing a semiconductor device having a controllably disordered superlattice according to the present invention.
Figure 1B:
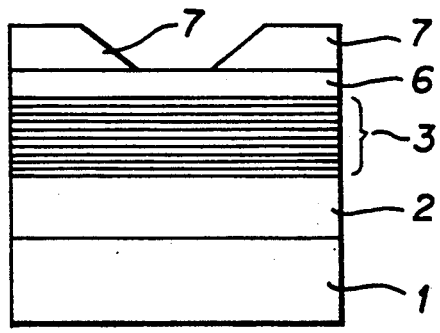
Figure 1C:
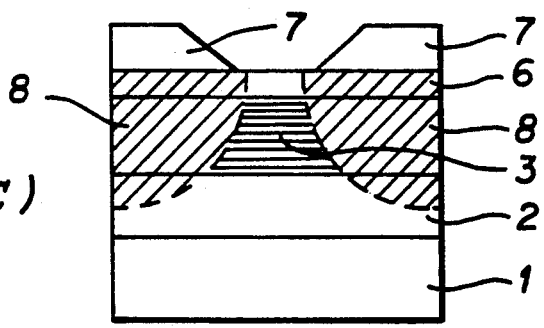

Turning now to the drawings and referring first to FIGS. 1(a)–1(c), there is shown a semiconductor device during various stages of its construction according to the method of the present invention. At first, as shown in FIG. 1(a), a GaAs buffer layer 2 is epitaxially grown on alGaAs substrate 1 and subsequently thereto GaAs and $Al_xGa_{1-x}As$ of about 100 Å thickness are alternately epitaxially grown to produce an AlGaAs series superlattice 3 of about 0.5 μm or less in thickness. As in the prior case, the GaAs layers serve as quantum wells and the AlGaAs layers as quantum barriers. The epitaxial growth phase is continued to produce an $Al_yGa_{1-y}As$ etching stopper layer 6 and a Se doped GaAs layer 7 thus resulting in the device as shown in FIG. 1(a).

Following completion of the epitaxial growth the device is then removed from the epitaxial growth chamber and the Se doped GaAs layer 7 is patterned as by etching. More particularly, a mask is photolithographically applied over the selenium doped layer 7 in a predetermined pattern, in the illustrated embodiment in the form of a central stripe. The device is then etched to remove the unmasked central stripe, producing the partially completed device illustrated in FIG. 1(b). The etching stopper layer 6, of a different composition than the doped semiconductor layer 7, serves to terminate the etching process and to protect the underlying superlattice layer 3. After patterning the selenium doped layer 7, the wafer as shown in FIG. 1(b) is annealed by either an open tube or closed tube method as previously described, thereby diffusing Se into the wafer and disordering portions 8 of the superlattice. The portion of the superlattice which remains non-disordered is determined by the striped pattern formed in the doped layer 7.

When a closed tube method is used for annealing, the wafer is placed in a quartz tube together with As of required quantity. The quartz tube is exhausted to vacuum and sealed, then heated up to a temperature of about 850° C. The diffusion speed of Se is dependent on the impurity concentration of the Se doped GaAs layer 7 and the Al proportion y of the $Al_yGa_{1-y}As$ etching stopper layer 6. When the aluminum molar proportion y is equal to about 0.42, and the impurity concentration of selenium is about $6 \times 10^{18} cm^{-3}$, the diffusion extends to a depth of about 0.3 μm after annealing at 850° C. for about 4 hours. By diffusing Se into the superlattice in this way, the Al atoms and Ga atoms are moved in the superlattice crystal structure, and the superlattice layer is disordered resulting in an AlGaAs alloy of uniform composition. When an open tube method is used, Se is diffused by heating the tube to about 850° C. while flowing hydrogen diluted arsine or argon diluted arsine through the heated tube. The resultant structure is shown in FIG. 1(c) in which the Se diffusion has resulting in the controllable disordering of portions 8 of the superlattice layer leaving the central stripe region 3 in a non-disordered condition.

In the method according to the present invention, the selenium doped semiconductor layer is produced in a predetermined spatial relationship with respect to the superlattice by an epitaxial growth process. The superlattice is then disordered by diffusion of selenium from the selenium doped semiconductor layer into the superlattice. The time and temperature of annealing are controlled to cause the selenium dopant to diffuse into and thereby disorder portions 8 of the superlattice layer, leaving the central portion 3 in a non-disordered state. By this method of the present invention, the vapor plating process for producing a silicon film or germanium film and the subsequent removal of that film, which is required in the disordering methods of the prior art, is no longer required. Likewise, the process of producing and later removing a diffusion mask, as in the disordering method using zinc or sulphur of the prior art, is no longer required. The number of steps involved in the production process is thus reduced thereby reducing the overall device cost. Since the rate of diffusion of selenium is slower than that of other materials such as silicon, the time control for determining the extent and depth of diffusion is more precise.

Although in the above-illustrated embodiment, an $Al_yGa_{1-y}As$ etching stopper layer 6 is utilized to prevent the superlattice layer from being etched, this layer can be deleted, although finer control of the etching process will be required. Furthermore, in another embodiment, a Se doped layer can be produced below, rather than above, the superlattice to effect diffusion.

Turning to FIG. 2, there is shown the production process steps of a semiconductor laser according to the method of the present invention. The process is started by epitaxially growing a p-type AlGaAs lower cladding layer 19a onto a p-type GaAs substrate 16. The AlGaAs superlattice 10 is then epitaxially grown onto the wafer by alternately laminating GaAs quantum well and $Al_xGa_{1-x}As$ quantum barrier layers. In a typical implementation the molar proportion x of aluminum in the barrier layers may be about 0.5, the well and barrier layers may each be about 100 Å thick, and the total superlattice layer may be about 0.1 μm thick. In the illustrated embodiment, an n-type AlGaAs upper cladding layer 19b of about 0.9 μm is grown on the superlattice layer, and an n-type GaAs contact layer 11 of about 0.5 μm on the cladding layer. The final layer grown in the epitaxial growth phase is Se doped GaAs layer of about 1 μm with relatively high Se concentration of about $5 \times 10^{18} cm^{-3}$. The Se doped layer 7 is then photolithographically patterned and etched to produce the wafer as shown in FIG. 2(b). In the FIG. 2 embodiment, the contact layer 11 can serve as an etching stop and, as in the prior embodiment, the pattern of the stripe etched into the doped layer 7 determines the pattern of the non-disordered region of the superlattice active layer.

Figure 2A:
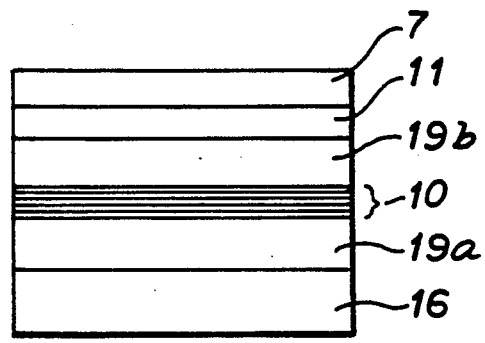
FIGS. 2(a)–2(d) are diagrams showing a production process of a semiconductor laser device according to the present invention.
Figure 2B:
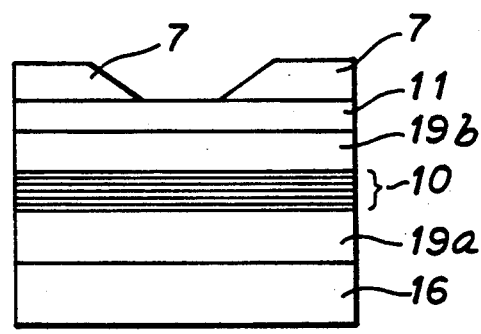
Figure 2C:
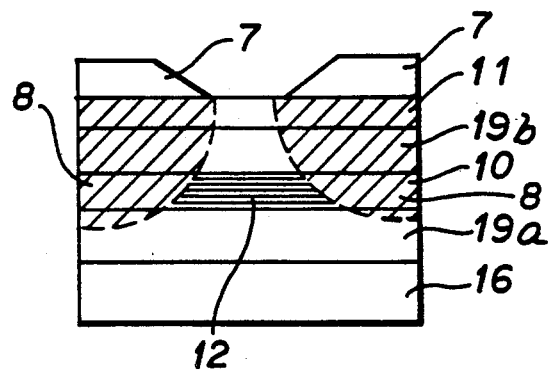
Figure 2D:
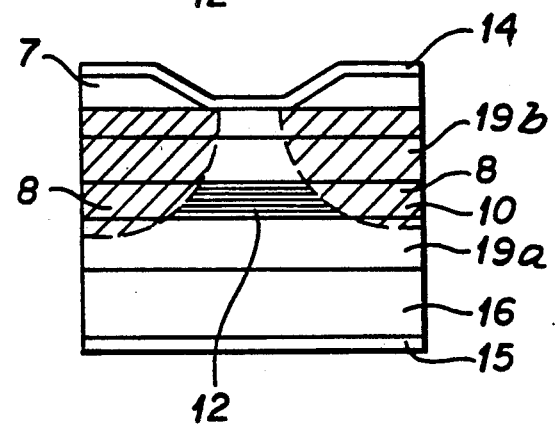
Figure 3A:
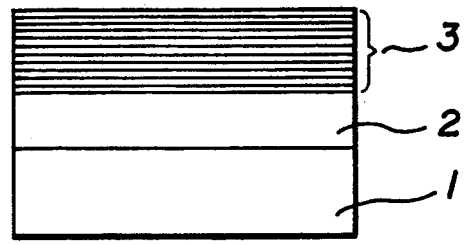
FIGS. 3(a)–3(d) are diagrams showing a prior art method of disordering a semiconductor superlattice.
Figure 3B:
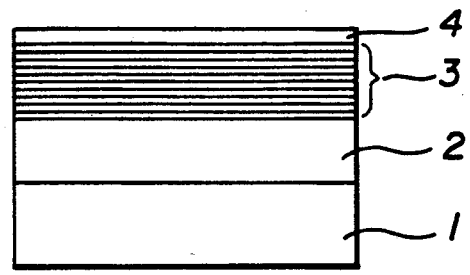
Figure 3C:
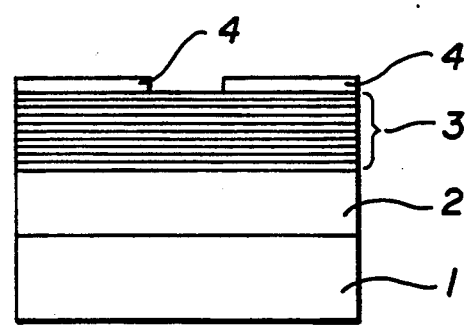
Figure 3D:
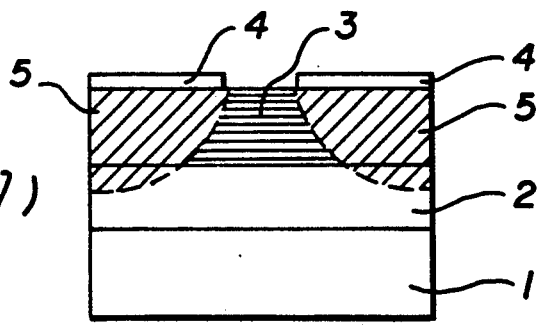
Figure 4A:
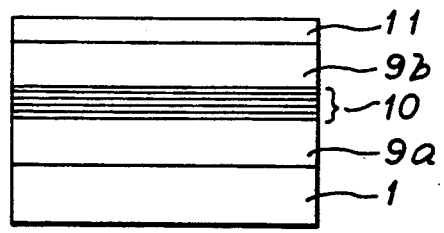
FIGS. 4(a)–4(f) are diagrams showing a production process of a semiconductor laser device according to a prior art method.
Figure 4B:
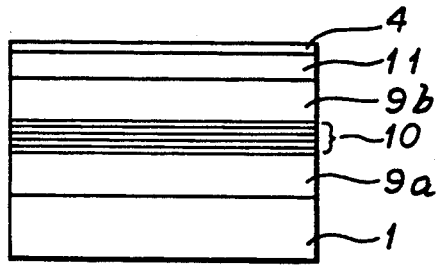
Figure 4C:
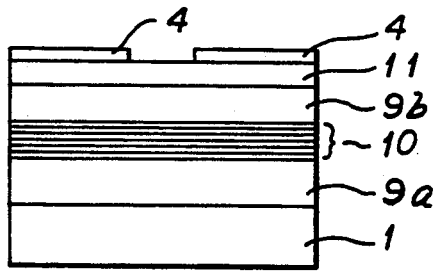
Figure 4D:
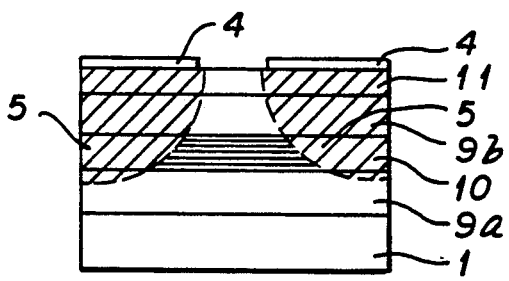
Figure 4E:
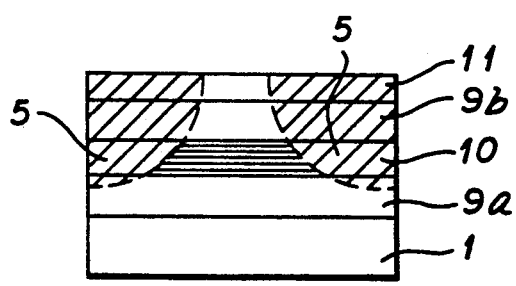
Figure 4F:
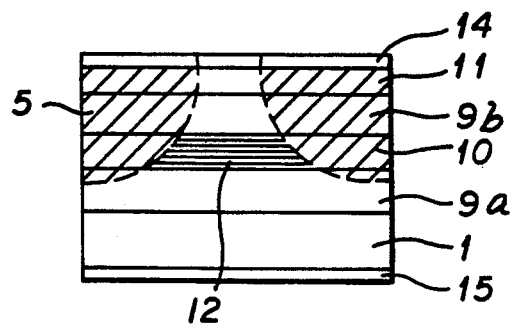

After patterning the doped layer 7, the diffusion process for the wafer is carried out using either an open tube or closed tube method, as previously described, in order to controllably disorder the superlattice. As can be seen from FIGS. 2(b) and 2(c), in order to disorder the superlattice 10, Se from the Se doped layer 7 must be diffused through the 0.5 μm of n-type GaAs contact layer 11, the 0.9 μm of n-type AlGaAs upper cladding layer 19b and the 0.1 μm of AlGaAs superlattice 10. Thus, the Se should be diffused at least to a depth of 1.5 μm and preferably to a depth of 1.6 μm in order to disorder a sufficient portion of the superlattice 10 so as to confine the light only to the undisordered portion 12 of the superlattice. A diffusion depth of 1.6 μm may be achieved by annealing the device at a temperature of about 890° C. for about 23 hours. After the superlattice 10 has been disordered, and without removal of the doped layer 7, electrodes 14 and 15 are attached to complete the semiconductor laser device as shown in FIG. 2(d).

In the semiconductor laser device of this embodiment, a portion of the superlattice active layer 10 is disordered by Se which is diffused from the high concentration Se doped GaAs layer 7. The refractive index of this disordered portion is lower than that of the undisordered portion 12, and the generated light is confined in the undisordered portion 12, to produce a light waveguide, and the transverse mode of the device is thereby controlled. Furthermore, carriers injected into the non-disordered central portion of the laser remain confined due to the higher band gap of the cladding layers and the disordered alloyed portions of the superlattice layer.

It can be seen that the production of a semiconductor laser device by the method of the present invention has several advantages over the methods of the prior art. The method of the present invention does not require a separate vapor plating process to form the diffusion layer, rather this layer is grown through an epitaxial growth process thereby making efficient use of the same apparatus used to form the other layers of the device. Additionally, the separate step of removing the diffusion layer or a diffusion mask after the diffusion has been completed is not necessary according to the method of the present invention. Rather, the Se doped GaAs diffusion layer may remain on the wafer with the electrode attached thereto in order to complete the semiconductor laser device. By the method of the present invention, the extent and depth of the diffusion may be more precisely controlled due to the relatively slow diffusion rate of Se as compared to the quicker diffusion rate of Si or Ge of the prior art methods. Indeed, as will become more apparent, in most laser devices constructed in accordance with the invention, due to the number and thickness of layers which are typically deposited, diffusion temperatures of at least 800° C. are usually required and diffusion times of 15 hours or more.

Figure 5:
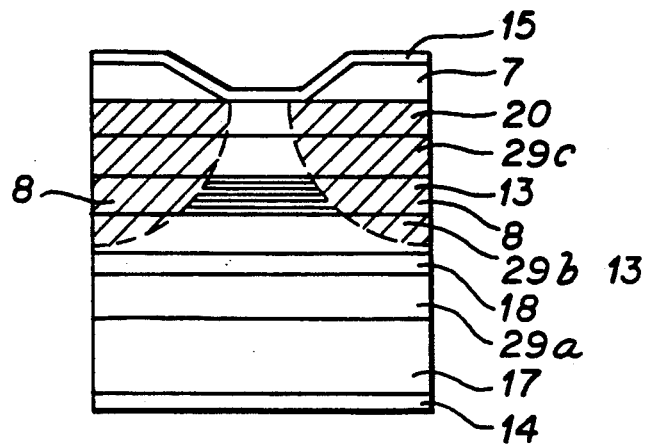
FIG. 5 is a diagram showing a semiconductor laser device according to another embodiment of the present invention.

Turning now to FIG. 5, there is shown another semiconductor laser device produced by the method of the present invention. In this device the active layer and the superlattice are separated by a thin cladding layer 29b. This semiconductor laser device is produced by first epitaxially growing an n-type AlGaAs lower cladding layer 29a on an n-type GaAs substrate 17. An AlGaAs active layer 18 is then epitaxially grown on the lower cladding layer followed by a p-type AlGaAs upper cladding layer 29b of about 0.3 μm in thickness. Next a light guide layer 13 comprising an AlGaAs series superlattice of about 0.3 μm is epitaxially grown followed by another p-type AlGaAs upper cladding layer 29c of about 0.3 μm in thickness, a p-type GaAs contact layer of about 0.5 μm in thickness and an Se doped GaAs layer of about 1 μm with an Se concentration of about $5 \times 10^{18} cm^{-3}$.

Following the epitaxial growth phase, the doped layer 7 is patterned as in the FIG. 4 embodiment by photolithographically depositing a mask then etching away a central stripe whose pattern will determine the pattern of the non-disordered region of the superlattice layer. The diffusion process is then carried out using either an open or closed tube method, as previously described, wherein a diffusion depth of about 1.3 μm, i.e. through the superlattice light guide layer 13 and into the upper cladding layer 29b, is achieved at a temperature of about 890° C. for about 15 hours. The semiconductor laser device is then completed by attaching the lower 14 and upper 15 electrodes.

As can be seen in FIG. 5, a portion of the light guide layer 13 is disordered by the Se which is diffused from the high concentration Se doped GaAs layer 7. The thickness of the upper cladding layer 29b is less than approximately 0.5 μm, and as a result a portion of the light generated at the active layer 18 reaches the superlattice light guide layer 13. Since the disordered portion of the superlattice light guide layer has a lower refractive index than the non-disordered portion, the light which is generated by the active layer 18 and reaches the superlattice 13 is confined to the non-disordered portion, thereby providing a light waveguide and controlling the transverse mode of operation.

According to the embodiment of the semiconductor laser device depicted in FIG. 5, either a p-type or n-type GaAs substrate may be used. In contrast to the structure just described which used an n-type GaAs substrate, when using a p-type GaAs substrate, the lower cladding layer is of p-type material and the upper cladding layers and contact layer are of n-type material. As is well known, the selenium doped layer will be n-type. Thus, the embodiment using the n-type GaAs substrate is preferred for a lower threshold current because a reverse biased p-n junction is formed between the n-type disordered regions 8 and the p-type upper cladding layer 29b. Such a reverse biased junction at the regions external of the central stripe function as a current blocking mechanism, thereby lowering the laser oscillation threshold.

Figure 6:
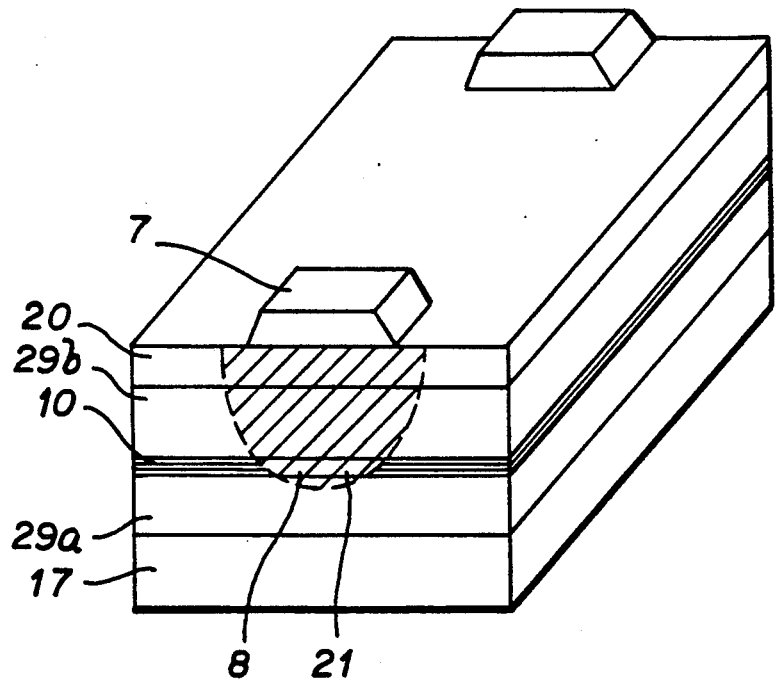
FIG. 6 is a diagram showing a semiconductor laser device according to yet another embodiment of the present invention.

FIG. 6 illustrates a further application of the present invention which can be used in combination with disordered regions for transverse mode control as described above. In the FIG. 6 embodiment, however, the disordered region is utilized to minimize the absorption of photons near the laser facets, thereby allowing higher power operation. Typically, the FIG. 6 implementation will be used along with transverse mode control as shown in FIG. 2. However, for the purposes of simplifying the description and the illustration, transverse mode control is not shown in FIG. 6 nor are the electrodes.

As in the prior embodiments, multiple layers are epitaxially grown on n-type GaAs substrate 17 including n-type AlGaAs lower cladding layer 29a, superlattice layer 10 formed of alternating thin layers of GaAs and AlGaAs, p-type AlGaAs upper cladding layer 29b and p-type GaAs contact layer 20 followed by a continuous selenium doped GaAs layer 7. In the illustrated embodiments, the active layer maybe about 0.1 μm in thickness, the upper cladding layer about 0.9 μm in thickness and the contact layer 20 about 0.5 microns in thickness, as in the case of the FIG. 2 embodiment. Thus, like the FIG. 2 embodiment, in order to achieve a diffusion depth of about 1.6 μm diffusion should be conducted at a temperature of about 890° C. for about 23 hours.

As can be seen in FIG. 6, after the epitaxial growth phase and before annealing, the selenium doped layer is patterned to produce doped regions at the resonator end surfaces. Accordingly, after the diffusion process, which is controlled to diffuse selenium impurities into the superlattice layer 10, a disordered portion 21 of the superlattice 10 is produced adjacent the laser facets. Since this disordered portion 21 has a higher energy band gap than the superlattice, it is transparent to the light generated inside the laser resonator. As a result, the occurrence of non-radiative recombinations in the end sections 21 of the light guide is substantially reduced (i.e., light absorption in this area is reduced), thereby reducing power dissipation and heat generation in the end sections 21. Thus, the laser can be operated at higher power and can produce greater light output than without the disordered end sections 21.

The above-described embodiments have emphasized disordering of a superlattice comprising GaAs and AlGaAs, but the method of the present invention can also be applied to an InGaAsP series superlattice or an AlGaInP series superlattice and results in the same disordering of the superlattice.

It should now be apparent that the present invention provides a relatively simple, inexpensive and particularly effective method for disordering a superlattice in order to produce a semiconductor laser device. Like the prior art, the present invention requires the photolithographic patterning of a layer and etching away of a central stripe region of that layer. However, unlike the prior art, the layer which is etched is, in the first instance, deposited much more economically than in the prior art and in the second instance need not be removed before forming electrodes.

More particularly, in the prior art diffusion processes, the layer is deposited in a separate apparatus either by vacuum deposition or chemical vapor deposition, both of which require transfer of the wafer to another complex piece of equipment. According to the invention, the layer is deposited in the same epitaxial growth phase which forms the superlattice.

On the second point, according to the prior art processes, the layers must be removed because they are not part of the crystal structure and they are often insulators. As such, they cannot be left between the laser device and its electrodes. According to the invention, however, the layer can be left in place because it is part of the crystal structure—it is epitaxially grown. Furthermore, the layer is doped and therefore it is conductive so that an electrode can be formed on the surface of the doped layer without requiring its removal.

Finally, the present invention offers fineness of control due to the comparatively lower diffusion rate of selenium through the layers in question. Indeed, for most practical devices, considering the concentration of selenium in the doped layer and the thicknesses of the layers through which is must diffuse, annealing will seldom be conducted at temperatures below about 800° C. for a period of less than 15 hours.

What is claimed is:

1. A method of producing a semiconductor device having a semiconductor superlattice active region bounded by a disordered region, the method comprising the steps of:
   conducting an uninterrupted epitaxial growth phase on a semiconductor substrate which includes sequentially growing a superlattice layer and as a final layer a selenium doped semiconductor layer which has a predetermined spatial relationship to the superlattice layer,
   removing a portion of the selenium doped semiconductor layer to produce a predetermined pattern therein,
   annealing the semiconductor device to diffuse the selenium dopant from the doped layer, controlling the time and temperature of annealing to cause the selenium dopant to diffuse into and thereby disorder a part of the superlattice active layer leaving a non-disordered region determined by the pattern of the doped layer, and
   forming contacts on the device on the substrate and said final layer.

2. The method of claim 1 wherein the step of removing comprises producing a mask on the doped layer and etching an unmasked portion of the doped layer away.

3. The method of claim 2 wherein the step of removing includes producing a mask having a pattern in the form of an unmasked stripe of predetermined width.

4. The method of claim 2 wherein the epitaxial growth phase includes growing an etching stop layer intermediate the superlattice layer and the doped layer for preventing the etching of the superlattice layer.

5. The method of claim 1 wherein said semiconductor superlattice is selected from the group consisting of AlGaAs, InGaAsP and AlGaInP.

6. The method of claim 1 in which the step of growing the superlattice layer comprises growing alternating layers of GaAs and AlGaAs.

7. The method of claim 6 in which the selenium doped semiconductor layer comprises GaAs doped with selenium with a concentration of about at least $5 \times 10^{18} cm^{-3}$.

8. The method of claim 7 in which the annealing is conducted at a temperature of at least 800° C. for a period of at least 15 hours.

9. A method of producing a semiconductor buried heterostructure laser device comprising the steps of:
   conducting an uninterrupted epitaxial growth phase which includes epitaxially growing on a semiconductor substrate successive layers including a lower cladding layer, a superlattice active layer, an upper cladding layer, and a selenium doped semiconductor layer,
   etching a striped portion from the selenium doped semiconductor layer;
   annealing the laser device to diffuse selenium from the selenium doped semiconductor layer, controlling the time and temperature of annealing to cause the selenium dopant to diffuse into and thereby disorder regions of the superlattice active layer bounding a non-disordered stripe region of the superlattice active layer, and
   forming contacts on the laser device on the substrate and the selenium doped semiconductor layer.

10. The method of claim 9 wherein the etching step comprises producing a mask on the doped layer leaving the striped portion unmasked, and etching the unmasked striped portion of the doped layer away.

11. The method of claim 9 wherein said semiconductor superlattice is selected from the group consisting of AlGaAs, InGaAsP and AlGaInP.

12. The method of claim 9 in which the step of growing the superlattice layer comprises growing alternating layers of GaAs and AlGaAs.

13. The method of claim 12 in which the selenium doped semiconductor layer comprises GaAs doped with selenium with a concentration of about at least $5 \times 10^{18} cm^{-3}$.

14. The method of claim 13 in which the annealing is conducted at a temperature of at least 800° C. for a period of at least 15 hours.

* * * * *